United States Patent
Hsu

(10) Patent No.: US 7,463,649 B2
(45) Date of Patent: Dec. 9, 2008

(54) SYSTEM AND METHOD FOR CHECKING VALIDITY OF DATA TRANSMISSION

(75) Inventor: Chun-Pin Hsu, Tu-Cheng (TW)

(73) Assignee: Hon Hai Precision Industry Co., Ltd., Taipei Hsien (TW)

( * ) Notice: Subject to any disclaimer, the term of this patent is extended or adjusted under 35 U.S.C. 154(b) by 707 days.

(21) Appl. No.: 11/025,557

(22) Filed: Dec. 29, 2004

(65) Prior Publication Data

US 2006/0050737 A1    Mar. 9, 2006

(30) Foreign Application Priority Data

Apr. 9, 2004    (TW) ............................... 93109875 A

(51) Int. Cl.
  *H04J 3/24* (2006.01)
(52) U.S. Cl. ..................... 370/474; 714/746
(58) Field of Classification Search ................ 714/774, 714/751, 752, 748; 371/37.8, 37.1, 38.1
See application file for complete search history.

(56) References Cited

U.S. PATENT DOCUMENTS

| 5,563,746 | A | * | 10/1996 | Bliss ........................... 360/53 |
| 5,600,663 | A | * | 2/1997 | Ayanoglu et al. ........... 714/774 |
| 5,815,516 | A | | 9/1998 | Aaker et al. |
| 6,128,763 | A | * | 10/2000 | LoGalbo et al. ............. 714/774 |
| 6,279,140 | B1 | | 8/2001 | Slane |
| 6,587,526 | B1 | * | 7/2003 | Li et al. ....................... 375/355 |
| 6,792,049 | B1 | * | 9/2004 | Bao et al. ..................... 375/285 |
| 6,952,454 | B1 | * | 10/2005 | Jalali et al. .................. 375/260 |
| 7,036,065 | B2 | * | 4/2006 | Hessel et al. ................. 714/746 |
| 7,296,057 | B2 | * | 11/2007 | Vincent ....................... 709/206 |

OTHER PUBLICATIONS

John G. Fletcher (IEEE Transactions On Communications, vol. COM-30, No. 1, Jan. 1982 "Arithmetic Checksum for Serial Transmissions".*

* cited by examiner

*Primary Examiner*—Huy D. Vu
*Assistant Examiner*—David Oveissi
(74) *Attorney, Agent, or Firm*—Morris Manning & Martin; Tim Tingkang Xia, Esq.

(57) ABSTRACT

A system for checking the validity of data transmission includes a data transmitting computer (1), a data receiving computer (2), and a network (3). The data transmitting computer is used for generating a check-code of original data, and sending a data packet, which includes the original data and the check-code, to the data receiving computer via the network. The data transmitting computer includes a shift operation unit (111), an addition operation (112) unit, a complement operation unit (113), and a control unit (114). The data receiving computer is used for receiving the data packet from the data transmitting computer, and determining whether the data packet is valid. The data receiving computer includes a shift operation unit (211), an addition operation unit (212), and a control unit (213). A related method is also disclosed.

13 Claims, 5 Drawing Sheets

SYSTEM AND METHOD FOR CHECKING VALIDITY OF DATA TRANSMISSION

BACKGROUND OF THE INVENTION

1. Field of the Invention

The present invention relates to systems and methods for checking the validity of electronic data transmission, and particularly to a system and method for checking the validity of data transmission through a network according to a checksum mechanism.

2. Prior art of the invention

In any communication system, it is desirable to detect data transmission errors. Each packet transmitted across a communications network between nodes contain data and a header that describes the data. In a typical communications system utilizing Internet Protocol (IP), a sending computer or node transmits the header and the data to one or more receiving computers or nodes. The header contains a checksum and other components. The checksum generated by the sending node is for examining the data, and the receiving node uses it to determine whether any errors were introduced into the data during transmission. In order to generate the header, the sending node must read all the data. This usually requires the sending node to examine every byte of the data twice, once to generate the checksum and again to transmit the data.

Presently, a checksum mechanism is usually used to check whether the data have been interfered with during the data transmission. For example, the transmission communication protocol (TCP) uses a checksum to protect the data which is transmitted. This checksum is located in the TCP header of the Internet datagram packet. As described above, all of the data must be examined before the data can begin to be transmitted. This results in two adverse consequences. First, all of the bytes of data must be read twice, once to generate the checksum, and again to transmit the data. This cuts down the maximum throughput possible for this protocol. Second, the beginning of the data cannot be transmitted until the end of the data is known. This adds to the latency of transmission.

U.S. Pat. No. 5,815,516 issued on Sep. 29, 1998 and entitled "Method And Apparatus For Producing Transmission Control Protocol Checksums Using Internet Protocol Fragmentation" discloses a method and apparatus for producing transmission control protocol (TCP) checksums using IP fragmentation. The TCP uses a checksum to protect the data which is transmitted. This checksum is located in the TCP header of the Internet datagram packet. In the disclosed method, a TCP module receives a data packet to be transmitted, and prepares a first IP data fragment without a checksum for the received data packet. The first IP data fragment is transmitted. During the transmission of the first IP data fragment, a checksum is generated. Then an IP header fragment including the generated checksum is transmitted.

However, there is nothing known in the art which can check error data generated when data bits exchange places; that is, when data in two or more data bytes is out of order. This can occur when the data transmission through the network is interfered with in some way. The above-mentioned solutions cannot reliably check for such error data. A system and method for checking the validity of data transmission which can overcome the above-mentioned problem is desired.

SUMMARY OF THE INVENTION

Accordingly, a main objective of the present invention is to provide a system and method for checking the validity of data transmission, and particularly for checking whether data are out of order due to interference occurring during transmission of the data over a network.

To accomplish the above objective, a system for checking the validity of data transmission in accordance with a preferred embodiment of the present invention comprises a data transmitting computer, a data receiving computer, and a network.

The data transmitting computer is provided for generating a check-code of original data, and sending a data packet, which comprises the original data and the check-code, to the data receiving computer via the network. The data transmitting computer comprises a Central Processing Unit (CPU), a Peripheral Component Interface (PCI) bus, and a memory. The CPU comprises: a shift operation unit for performing a shift operation on data units of the original data; an addition operation unit for adding data in all data units after the shift operation to obtain a checksum1, according to an addition rule: adding each bit of one data unit to corresponding each bit of another data unit; a complement operation unit for calculating a 2's complement of the last $2^m$ bytes of the checksum1 to obtain a check-code, wherein "m" represents the number "0" or any natural number; and a control unit for reading the original data from the memory via the PCI bus, and sending a data packet including the original data and the check-code to the data receiving computer. The memory stores the original data to be sent to the data transmitting computer.

The data receiving computer is provided for receiving the data packet from the data transmitting computer, and checking and determining whether the data packet is valid. The data receiving computer comprises a CPU. The CPU comprises: a shift operation unit for performing a shift operation on the data units of the original data unpacked from the received data packet; an addition operation unit for adding the data units after the shift operation to obtain a checksum2, and adding the last $2^m$ bytes of the checksum2 to the check-code from the received data packet to obtain a checksum3; and a control unit for determining whether the data packet from the data transmitting computer is valid by checking whether the last $2^m$ bytes of the checksum3 equal "0."

Further, the present invention provides a method for checking the validity of data transmission using the above-described system, the method comprising the steps of: (a) reading original data; (b) performing a shift operation on data units of the original data according to a shift operation rule; (c) adding all data of the data units after the shift operation to obtain a checksum1; (d) regarding the last $2^m$ bytes of the checksum1 as a checksum11, and calculating a 2's complement of the checksum11 to obtain a check-code; (e) packing the check-code with the original data into a data packet; (f) sending the data packet to the data receiving computer via the network; (g) receiving the data packet from the data transmitting sending computer; (h) unpacking the data packet to obtain the original data and the check-code; (i) performing a shift operation on data units of the unpacked original data according to the shift operation rule; (j) adding all data of the data units after the shift operation of the immediately preceding step to obtain a checksum2; (k) regarding the last $2^m$ bytes of the checksum2 as a checksum22, and adding the checksum22 to the check-code from the data packet to obtain a checksum3; (l) regarding the last $2^m$ bytes of the checksum3 as a checksum33; (m) determining whether the data packet from the data transmitting computer is valid by checking whether the checksum33 equals "0"; and (n) accepting the valid data packet if the checksum33 equals "0"; or sending a request for resending of the data packet to the data transmitting computer if the checksum33 does not equal "0."

In summary, the system and method for checking the validity of data transmission can reliably check whether the data are valid. That is, whether of not interfering factors during transmission through the network have caused any data bits to exchange places.

Other objects, advantages and novel features of the present invention will be drawn from the following detailed description with reference to the attached drawings, in which:

DETAILED DESCRIPTION OF THE INVENTION

Figure 1:
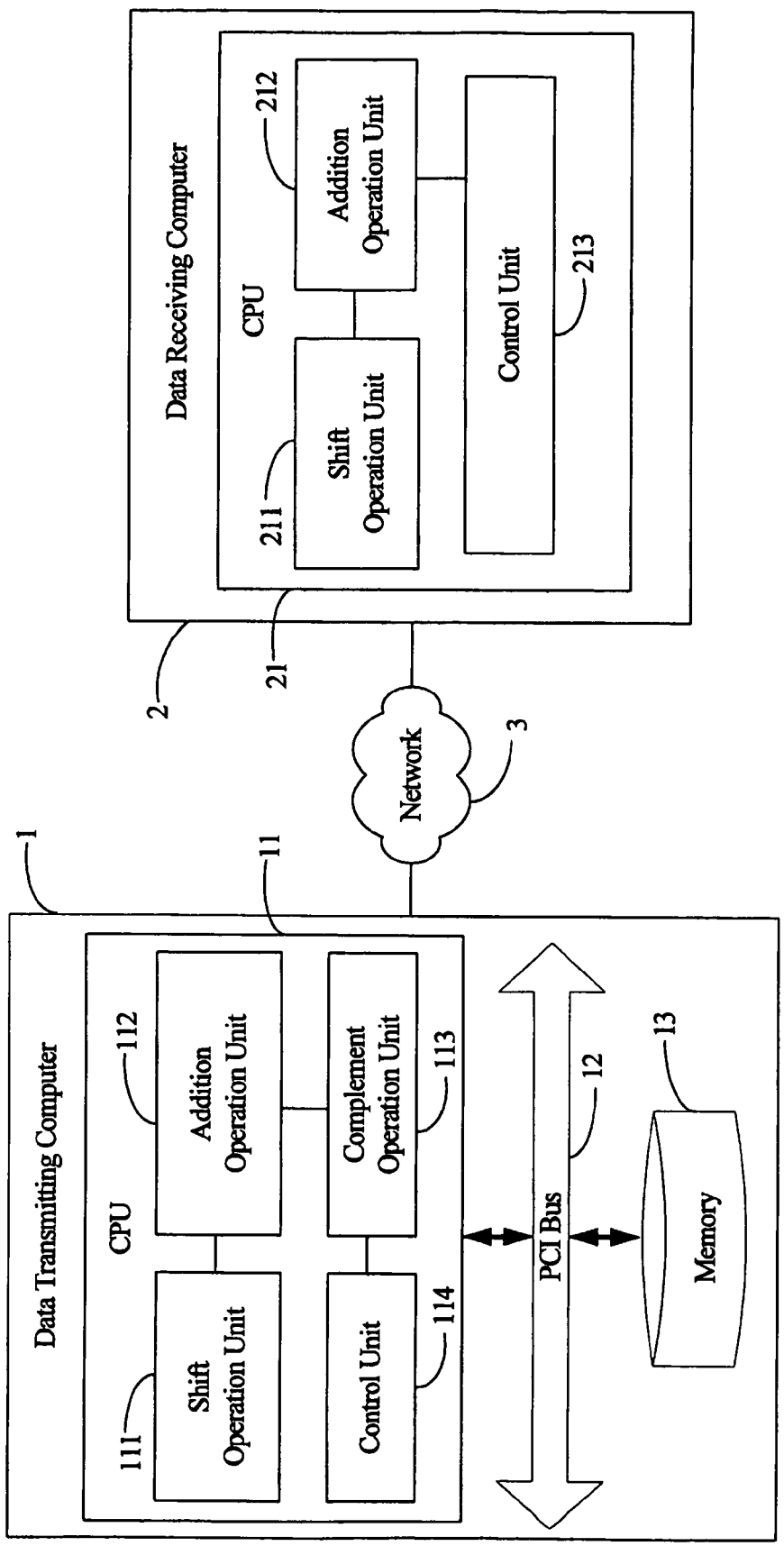
FIG. 1 is a block diagram of hardware infrastructure of a system for checking the validity of data transmission in accordance with the preferred embodiment of the present invention.

FIG. 1 is a block diagram of hardware infrastructure of a system for checking the validity of data transmission (hereinafter, "the system") in accordance with the preferred embodiment of the present invention. The system comprises a data transmitting computer 1, a data receiving computer 2, and a network 3. The data transmitting computer 1 is connected to the data receiving computer 2 via the network 3. The data transmitting computer 1 comprises a Central Processing Unit (CPU) 11, a Peripheral Component Interface (PCI) bus 12, and a memory 13. The CPU 11 is connected to the memory 13 via the PCI bus 12. The memory 13 stores original data which need to be sent to the data receiving computer 2. The original data comprise N data units (symbolically depicted as data $unit_0$, data $unit_1$, data $unit_2$, . . . , and data $unit_{(N-1)}$ in FIG. 2). Each data unit contains $2^m$ bytes (symbolically depicted as $byte_0$, $byte_1$, . . . , and $byte_{(2^m-1)}$), wherein "m" represents the number "0" or any natural number.

Each byte comprises 8 bits symbolically depicted as $b_0$, $b_1$, $b_2$, . . . , and $b_7$. Each bit comprises a binary number "0" or "1." The network 3 is an electronic communications network that supports a transmission control protocol or an Internet protocol (TCP/IP). The network 3 may be an intranet, the Internet, or any other suitable type of communications network. The CPU 11 comprises a shift operation unit 111, an addition operation unit 112, a complement operation unit 113, and a control unit 114. The shift operation unit 111 performs a shift operation on the data units of the original data. The shift operation may be either a left shift operation or a right shift operation. The addition operation unit 112 adds data in all data units after the shift operation to obtain a checksum1. The complement operation unit 113 calculates a 2's complement of the last $2^m$ bytes of the checksum1 to obtain a check-code. The control unit 114 reads the original data from the memory 13 via the PCI bus 12, and sends a data packet to the data receiving computer 2. The data packet comprises the original data and the check-code.

The check-code contains $2^m$ bytes, wherein "m" represents the number "0" or any natural number. That is, the check-code may be 1 byte, 2 bytes, 4 bytes, etc. In such case, the shift operation unit 111 shifts all the data units with a cycle of "$2^m$" bytes, namely $8*2^m$ bits. The shift operation may be either a left shift operation or a right shift operation. The left shift operation on the data $unit_{(N-1)}$ can be expressed as "$2^m Byte_{(N-1)} << Mod (N-1, 8*2m)$," in which the operator "<<" represents the left shift operation, and "Mod" is the abbreviation of "modulus." Mod $(N-1, 8*2^m)$ represents a remainder produced by N−1 being divided by $8*2^m$, and means a digit by which the data $unit_{(N-1)}$ is left shifted. In comparison, the right shift operation on the data $unit_{(N-1)}$ can be expressed as "$2^m Byte_{(N-1)} >> Mod(N-1, 8*2^m)$," in which the operator ">>" represents the right shift operation.

The data receiving computer 2 receives and checks the data packet from the data transmitting computer 1, in order to determine whether the data packet is valid. The data receiving computer 2 comprises a CPU 21. The CPU 21 comprises a shift operation unit 211, an addition operation unit 212, and a control unit 213. The shift operation unit 211 performs a shift operation on unpacked data units of the original data of the received data packet. The shift operation may be either a left shift operation or a right shift operation. The addition operation unit 212 adds the data units after the shift operation to obtain a checksum2, and further adds the last $2^m$ bytes of the checksum2 to the check-code from the data packet to obtain a checksum3. The control unit 213 determines whether the data packet from the data transmitting computer 1 is valid by checking whether the last $2^m$ bytes of the checksum3 equal "0." If the last $2^m$ bytes of the checksum3 equal "0," the data receiving computer 2 accepts the data packet. In contrast, if the last $2^m$ bytes of the checksum3 do not equal "0," the data receiving computer 2 considers the data packet as being invalid, and sends a request for resending of the data packet to the data transmitting computer 1.

Figure 2:
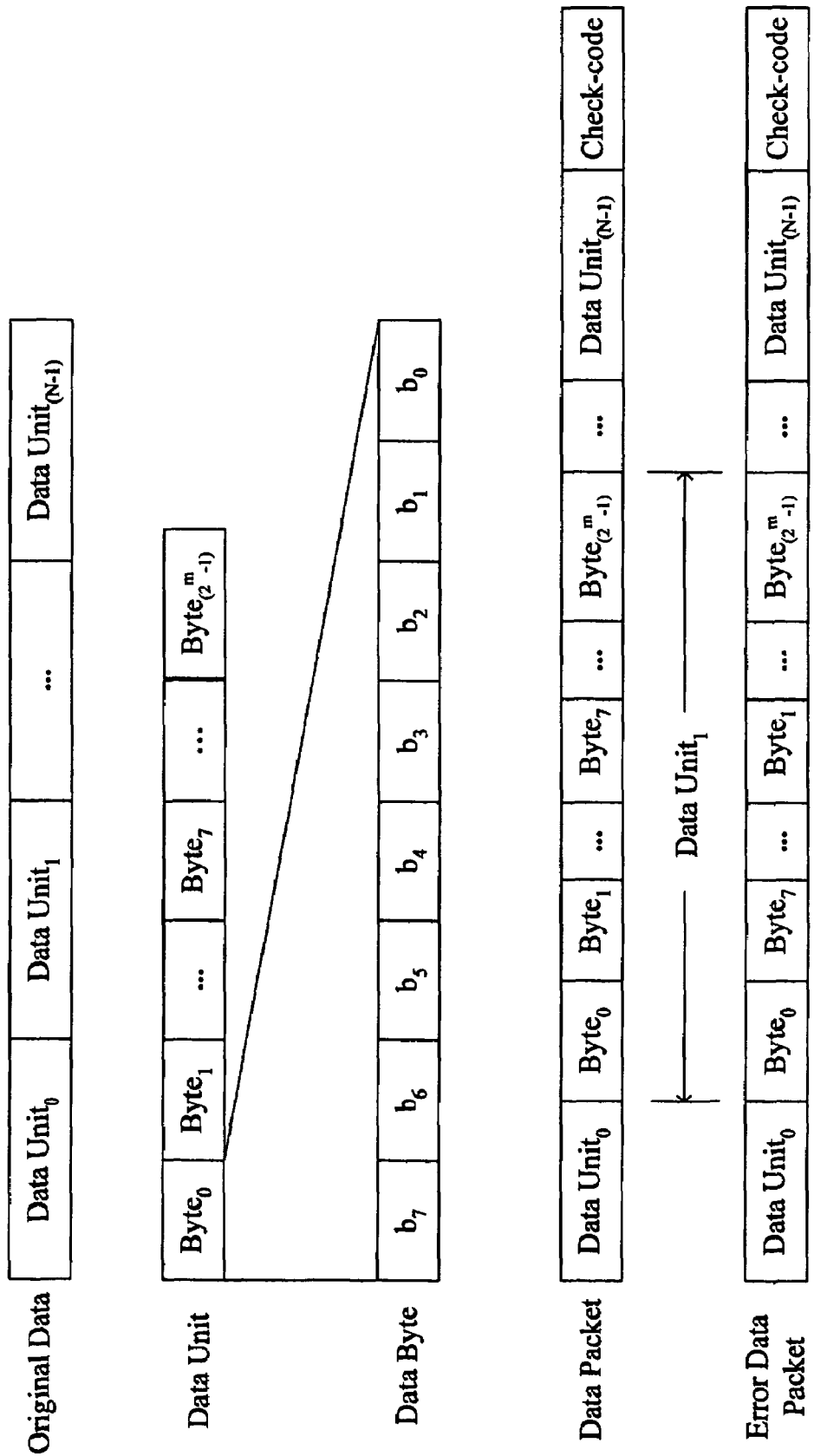
FIG. 2 is a schematic diagram of data structures of original data, any one data unit, any one data byte, a data packet, and a corresponding data packet having errors.

FIG. 2 is a schematic diagram of data structures of the original data, any one data unit, any one data byte, the data packet, and an error data packet. The original data comprise N data units: data $unit_0$, data $unit_1$, data $unit_2$, . . . , data $unit_7$, data $unit_8$, . . . , and data $unit_{(N-1)}$. Each data unit comprises $2^m$ data bytes: $byte_0$, $byte_1$, . . . , and $byte_{(2m-1)}$. Each data byte comprises 8 bits: $b_0$, $b_1$, $b_2$, . . . , and $b_7$. The data packet comprises the original data and a corresponding check-code. The error data packet comprises replacement original data and a corresponding check-code. The replacement original data means that one or more data units of the original data are changed or replaced, due to factors such as interference occurring during the transmission of the data through the network 3. In FIG. 2, data $unit_1$ of the data package has been changed.

Figure 3:
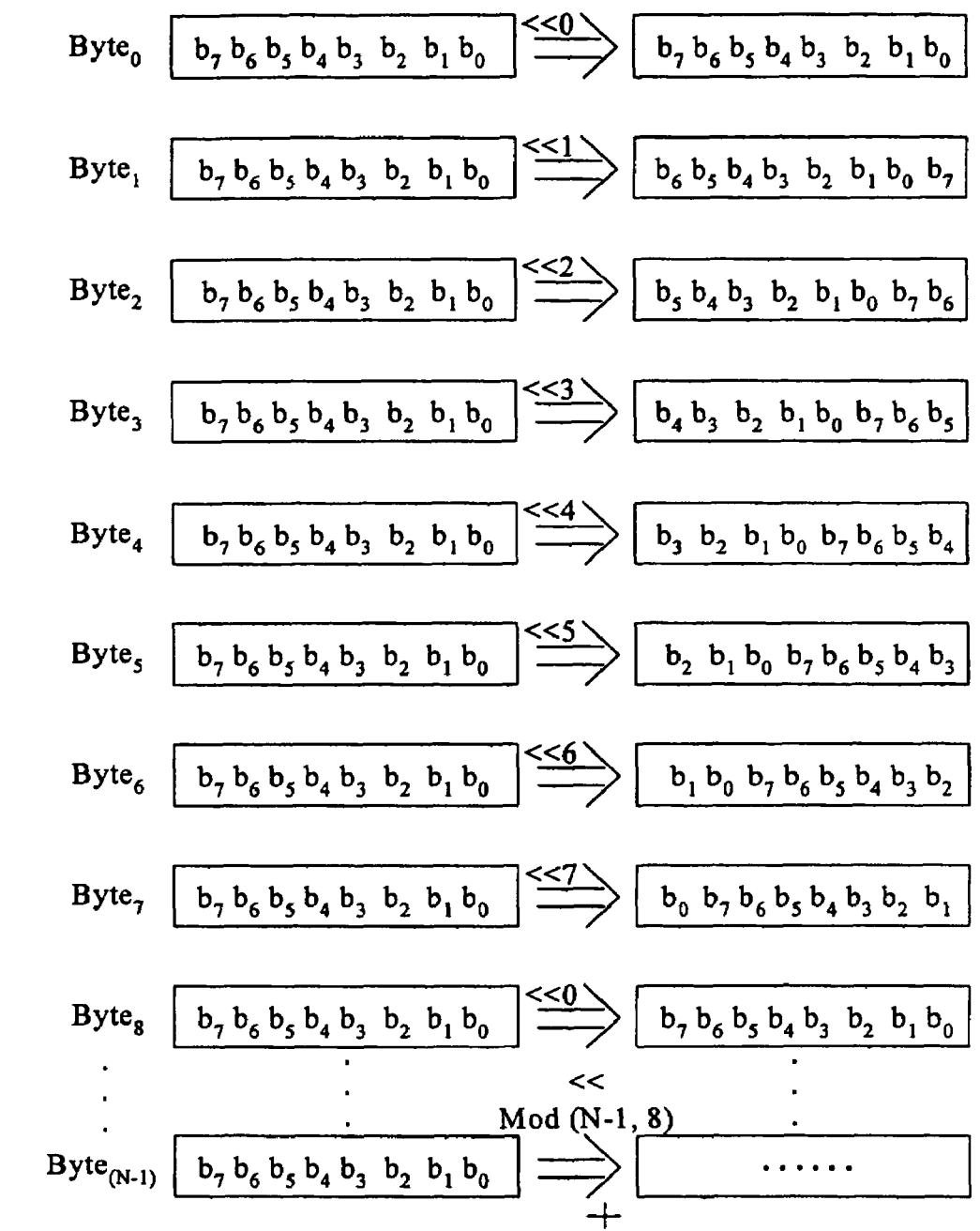
FIG. 3 is a schematic diagram of performing a left shift operation to obtain a one-byte sized check-code in a data transmitting computer of the system of FIG. 1.

FIG. 3 is a schematic diagram of performing a left shift operation to obtain a one-byte sized check-code in the data transmitting computer 1. For simplicity, the following description assumes that the check-code has a size of 1 byte (8 bits); that is, m equals "0." The control unit 114 reads original data from the memory 13. The original data comprises N data units. Each data unit comprises one byte. The shift operation unit 111 left shifts $byte_{(N-1)}$ by a digit of Mod ((N−1), 8). According to this rule, data $unit_0$ ($byte_0$ in FIG. 3) remains unchanged because Mod (0, 8) is "0." $Byte_1$ is left shifted by 1 digit because Mod (1, 8) is "1." Therefore, $byte_8$ remains unchanged, and $byte_9$ is left shifted by 1 digit. After the shift operation is performed, the addition operation unit 112 adds all the data units to obtain a checksum1 symbolically depicted as "$c_k \ldots c_8 c_7 c_6 c_5 c_4 c_3 c_2 c_1 c_0$," and regards the last 8 bits (one byte) of the checksum1 "$c_7 c_6 c_5 c_4 c_3 c_2 c_1 c_0$" as a checksum11.

The complement operation unit 113 calculates a 2's complement of the checksum11 to obtain a check-code symbolically depicted as "$d_7d_6d_5d_4d_3d_2d_1d_0$." The data transmitting computer 1 sends the check-code together with the original data as the data packet to the data receiving computer 2.

Figure 4:
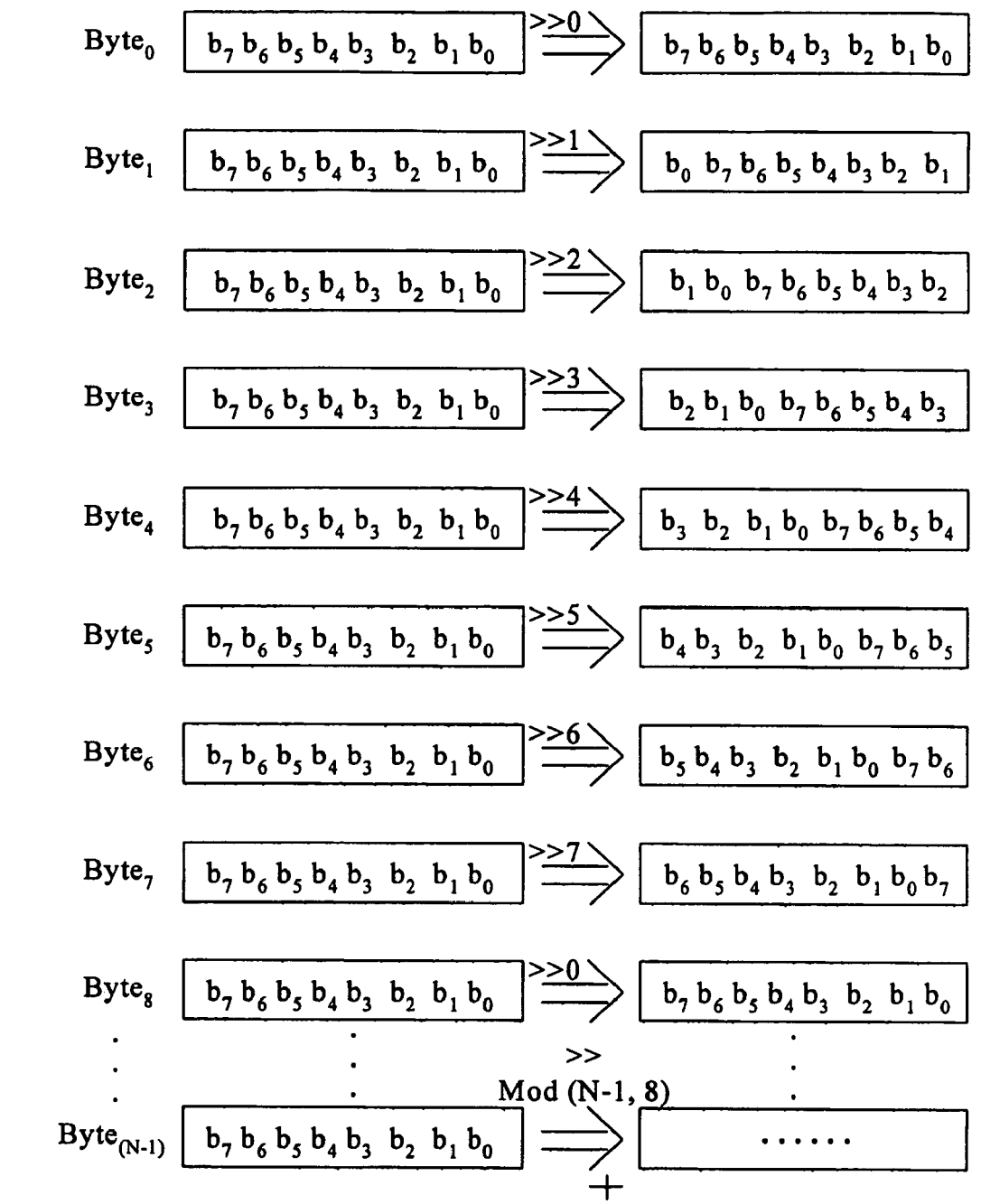
FIG. 4 is a schematic diagram of performing a right shift operation to obtain a one-byte sized check-code in the data transmitting computer of the system of FIG. 1.

FIG. 4 is a schematic diagram of performing a right shift operation to obtain a one-byte sized check-code in the data transmitting computer 1. The procedures are the same as those described above in relation to FIG. 3, except for replacing the left shift operation by the right shift operation.

Figure 5:
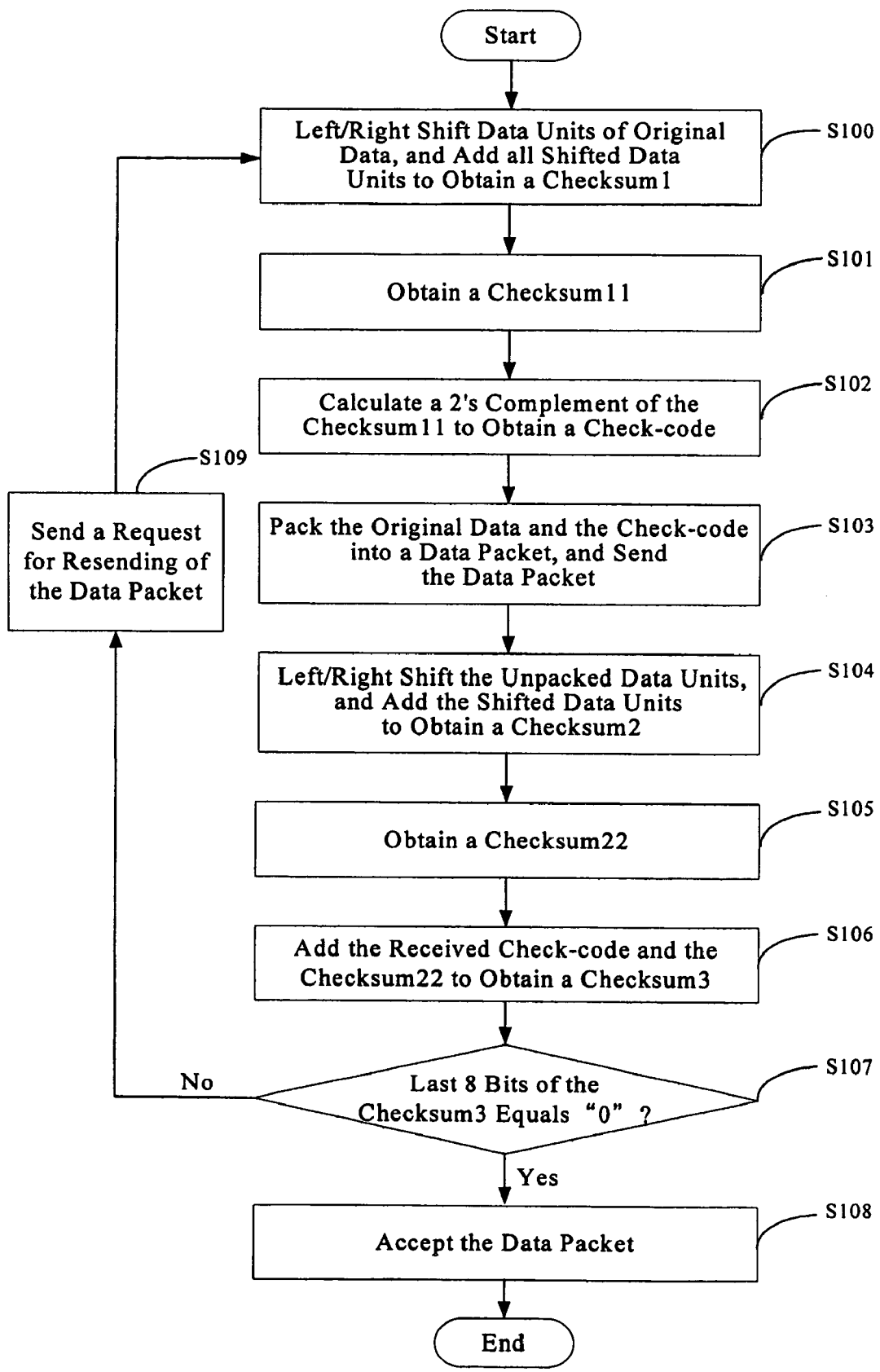
FIG. 5 is a flowchart of a preferred method for implementing the system of FIG. 1.

FIG. 5 is a flowchart of a preferred method for implementing the system. In step S100, the CPU 11 reads original data from the memory 13 via the PCI bus 12. The shift operation unit 111 left/right shifts the data in the data units of the original data according to the appropriate shift operation rule described above. The addition operation unit 112 adds all data of the data units after the shift operation to obtain a checksum1. In step S101, the control unit 114 regards the last 8 bits of the checksum1 as a checksum11. In step S102, the complement operation unit 113 calculates a 2's complement of the checksum11 to obtain a check-code. In step S103, the control unit 114 packs the check-code with the original data into a data packet, and sends the data packet to the data receiving computer 2 via the network 3. In step S104, the data receiving computer 2 unpacks the data packet so that the contents thereof reverts to the original data and the check-code. The shift operation unit 211 left/right shifts the data units of the original data according to the shift operation performed by the shift operation unit 111. This means that, for example, if the shift operation unit 111 performed a left shift operation, the shift operation unit 211 also performs a left shift operation. The addition operation unit 212 adds all data in the data units after the shift operation to obtain a checksum2. In step S105, the control unit 213 regards the last 8 bits of the checksum2 as a checksum22. In step S106, the addition operation unit 212 adds the checksum22 to the check-code from the data packet to obtain a checksum3. In step 107, the control unit 213 regards the last 8 bits of the checksum 3 as a checksum33, and determines whether the checksum33 equals "0." If the checksum33 equals "0," the control unit 213 determines that the received data packet is valid. Then in step 108, the data receiving computer 2 accepts the valid data packet, whereupon the procedure is finished. If the checksum33 does not equal "0," the control unit 213 determines that the received data packet is invalid. Then in step 109, the data receiving computer 2 sends a request for resending of the data packet to the data transmitting computer 1, whereupon the procedure returns to step S100 described above.

The following describes an example of implementing the system. A plurality of the following data bytes are ready to be sent: "45h," "7Eh," "33h," "51h," "BCh," "20h," "11h," "08h," "6Fh," "4Ah," "59h" and "09h" (h expresses a hexadecimal number). First, the shift operation unit 111 left shifts the data bytes. That is, 45h<<0, 7Eh<<1, 33h<<2, 51h<<3, BCh<<4, 20h<<5, 11h<<6, 08h<<7, 6Fh<<0, 4Ah<<1, 59h<<2, and 09h<<3. The addition operation unit 112 adds the data bytes to obtain a checksum1. That is, the checksum1=45h<<0+7Eh<<1+33h<<2+51h<<3+BCh<<4+20h<<5+11 h<<6+08h<<7+6Fh<<0+4Ah<<1+59h<<2+09h<<3=55Eh. The control unit 114 regards the last 8 bits of the checksum1 as a checksum11; that is, the checksum11=5Eh. The complement operation unit 113 calculates a 2's complement of the checksum11 to obtain a check-code. In this example, the check-code=A2h. Then, the control unit 114 packs the data bytes and the check-code "A2h" into a data packet, and sends the data packet to the data receiving computer 2 via the network 3. Now assume that the data bytes "33h" and "20h," and the data bytes "7Eh" and "09h," exchange places during the transmission. This can occur due to one or more factors such as interference on the network 3.

The data receiving computer 2 receives and unpacks the received data packet to obtain the data bytes and the check-code: "45h," "09h," "20h," "51h," "BCh," "33h," "11h," "08h," "6Fh," "4Ah," "59h," "7Eh," and "A2h." The shift operation unit 211 left shifts the data bytes to obtain a checksum2. That is, the checksum2=45h<<0+09h<<1+20h<<2+51h<<3+BCh<<4+33h<<5+11h<<6+08h<<7+6Fh<<0+4Ah<<1+59h<<2+7Eh<<3=4 35h. The control unit 213 regards the last 8 bits of the checksum2 as a checksum22; that is, the checksum22=35h. The addition operation unit 212 adds the check-code and the checksum22 to obtain a checksum3; that is, the checksum3=check-code+checksum22=A2h+35h=D7h. Obviously, the last 8 bits of the checksum3 do not equal "0." Therefore the control unit 213 regards the received data packet as being invalid. Then, the receiving computer 2 sends a request for resending of the data packet to the data transmitting computer 1.

Although the present invention has been specifically described on the basis of a preferred embodiment and preferred method, the invention is not to be construed as being limited thereto. Various changes or modifications may be made to the embodiment and method without departing from the scope and spirit of the invention.

What is claimed is:

1. A system for checking the validity of data transmission, the system comprising a data transmitting computer, a data receiving computer, and a network, wherein:

the data transmitting computer is provided for generating a check-code of original data, and sending a data packet, which comprises the original data and the check-code, to the data receiving computer via the network, the data transmitting computer comprising a Central Processing Unit (CPU), a Peripheral Component Interface (PCI) bus, and a memory, the CPU of the data transmitting computer comprising:

a shift operation unit for performing a shift operation on data units of the original data;

an addition operation unit for adding data in all data units after the shift operation to obtain a checksum1;

a complement operation unit for calculating a 2's complement of the last $2^m$ bytes of the checksum1 to obtain a check-code; and a control unit for reading the original data from the memory via the PCI bus, and sending a data packet comprising the original data and the check-code to the data receiving computer; and the data receiving computer is provided for receiving the data packet from the data transmitting computer, checking and determining whether the data packet is valid, the data receiving computer comprising a CPU, the CPU of the data receiving computer comprising:

a shift operation unit for performing a shift operation on the data units of the original data unpacked from the received data packet;

an addition operation unit for adding the data units after the shift operation to obtain a checksum2, and adding the last $2^m$ bytes of the checksum2 to the check-code from the received data packet to obtain a checksum3; and a control unit for determining whether the data packet from the data transmitting computer is valid by checking whether the last $2^m$ bytes of the checksum3 equals "0;" wherein "m" represents the number "0" or any natural number.

2. The system according to claim 1, wherein the memory is used for storing the original data to be sent to the data receiving computer.

3. The system according to claim 1, wherein the shift operation performed by the shift operation units of the data transmitting computer and the data receiving computer is a left shift operation.

4. The system according to claim 1, wherein the shift operation performed by the shift operation units of the data transmitting computer and the data receiving computer is a right shift operation.

5. The system according to claim 1, wherein each of the data units comprises $2^m$ bytes of the original data.

6. A computer-based method for checking the validity of data transmission from a data transmitting computer to a data receiving computer through a network, the method comprising the steps of:

reading original data;

performing a shift operation on data units of the original data according to a shift operation rule;

adding all data of the data units after the shift operation to obtain a checksum1;

regarding the last $2^m$ bytes of the checksum1 as a checksum11;

calculating a 2's complement of the checksum11 to obtain a check-code;

packing the check-code with the original data into a data packet;

sending the data packet to the data receiving computer via the network;

unpacking the data packet to obtain the original data and the check-code;

performing a shift operation on the data units of the unpacked original data according to the shift operation rule;

adding all data of the data units after the shift operation of the immediately preceding step to obtain a checksum2;

regarding the last $2^m$ bytes of the checksum2 as a checksum22;

adding the checksum22 to the check-code from the data packet to obtain a checksum3;

regarding the last $2^m$ bytes of the checksum3 as a checksum33;

determining whether the data packet from the data transmitting computer is valid by checking whether the checksum33 equals "0;" and accepting the valid data packet if the checksum33 equals "0;"

wherein "m" represents the number "0" or any natural number.

7. The method according to claim 6, further comprising the step of sending a request for resending of the data packet to the data transmitting computer if the checksum33 does not equal "0."

8. The method according to claim 6, wherein each of the data units comprises $2^m$ bytes of the original data.

9. The method according to claim 6, wherein the shift operation rule is either a left shift operation rule or a right shift operation rule.

10. A method for checking validity of data transmission from a data transmitting computer to a data receiving computer through a network, the method comprising the steps of:

reading data from said data transmitting computer;

retrieving a first checksum value based on said data;

retrieving a first check code by calculating a two's complement of a predetermined last part of said first checksum value;

transmitting said data and said first check code to said data receiving computer through said network;

retrieving a second checksum value based on said transmitted data;

retrieving a second check code by adding a predetermined last part of said second checksum value;

retrieving a third check code by adding said second check code to said first check code; and evaluating said validity of said data transmission by checking whether said third check code equals "0".

11. The method according to claim 10, wherein said first and second checksum values are retrieved in a same way, and said predetermined last part of said first checksum value used to create said first check code has a binary length same as that of said predetermined last part of said second checksum value used to create said second check code.

12. The method according to claim 10, wherein at least one of said first and second checksum values is retrieved by performing a shift operation on said data first and adding up said data.

13. The method according to claim 10, wherein said predetermined last part at least one of said first and second checksum values is the last $2^m$ bytes of said at least one of said first and second checksum values correspondingly, in which "m" represents the number "0" or any natural number.

* * * * *